(12) United States Patent
Rickers (10) Patent No.: US 9,748,511 B2
(45) Date of Patent: Aug. 29, 2017

(54) LIGHT-EMITTING DEVICE WITH ALTERNATING ARRANGEMENT OF ANODE PADS AND CATHODE PADS

(71) Applicant: OLEDWORKS GMBH, Aachen (DE)

(72) Inventor: Christoph Rickers, Wendhausen (DE)

(73) Assignee: OLEDWORKS GMBH, Aachen (DE)

( * ) Notice: Subject to any disclaimer, the term of this patent is extended or adjusted under 35 U.S.C. 154(b) by 0 days.

(21) Appl. No.: 14/892,588

(22) PCT Filed: May 22, 2014

(86) PCT No.: PCT/EP2014/060537
§ 371 (c)(1),
(2) Date: Nov. 20, 2015

(87) PCT Pub. No.: WO2014/187896
PCT Pub. Date: Nov. 27, 2014

(65) Prior Publication Data
US 2016/0133868 A1 May 12, 2016

(30) Foreign Application Priority Data
May 23, 2013 (EP) .................................... 13168856

(51) Int. Cl.
*H01L 33/36* (2010.01)
*H01L 51/52* (2006.01)
(Continued)

(52) U.S. Cl.
CPC ...... *H01L 51/5203* (2013.01); *H01L 51/0021* (2013.01); *H01L 51/5253* (2013.01); *H01L 51/56* (2013.01); *H01L 2251/5361* (2013.01)

(58) Field of Classification Search
CPC ............. H01L 51/5203; H01L 51/5209; H01L 51/5225
(Continued)

(56) References Cited

U.S. PATENT DOCUMENTS 6,344,665 B1 * 2/2002 Sung ..................... H01L 33/42
257/459
6,380,564 B1 * 4/2002 Chen ..................... H01L 33/38
257/94
(Continued)

FOREIGN PATENT DOCUMENTS

JP  2005202285 A   7/2005
WO  2011/094068 A1  8/2011
WO  2011094068 A1   8/2011

OTHER PUBLICATIONS

International Preliminary Report on Patentability received for PCT Patent Application No. PCT/EP2014/060537, completed on Nov. 24, 2015, 7 pages.

*Primary Examiner* — Victoria K Hall (57) ABSTRACT

The invention relates to a light-emitting device like an OLED comprising a light emission region between an anode (5) and a cathode (6). An alternating arrangement (9) of anode pads (11) for electrically connecting the anode and cathode pads (10) for electrically connecting the cathode and an encapsulation (8) are configured such that the anode and cathode pads are electrically connectable by straight anode and cathode electrical connectors (3, 4) through openings (12) of the encapsulation. The alternating arrangement of the anode and cathode pads can lead to a more homogenous electrical field between the anode and the cathode and therefore allows for an improved degree of homogeneity of light emission. More, since the alternating arrangement of the anode and cathode pads is connectable by corresponding straight connectors, the contacting of the pads can be performed technically relatively easily.

6 Claims, 11 Drawing Sheets

(51) Int. Cl.
*H01L 51/00* (2006.01)
*H01L 51/56* (2006.01)

(58) Field of Classification Search
USPC .......................................................... 257/99
See application file for complete search history.

(56) References Cited

U.S. PATENT DOCUMENTS

| | | | |
|---|---|---|---|
| 6,518,598 B1* | 2/2003 | Chen ..................... H01L 33/38 257/690 |
| 6,881,985 B2* | 4/2005 | Murakami ............ H01L 33/145 257/103 |
| 7,235,921 B2 | 6/2007 | Hieda et al. |
| 8,450,758 B2* | 5/2013 | Liu ........................ H01L 33/38 257/98 |
| 8,471,288 B2* | 6/2013 | Uemura ................. H01L 33/38 257/103 |
| 2005/0077818 A1* | 4/2005 | Hieda ................ H01L 51/5203 313/504 |
| 2005/0140273 A1* | 6/2005 | Guo ................... H01L 27/3211 313/504 |
| 2006/0001035 A1* | 1/2006 | Suehiro .................. H01L 33/38 257/91 |
| 2006/0113555 A1* | 6/2006 | Yang ...................... H01L 33/62 257/99 |
| 2006/0124954 A1* | 6/2006 | Akaishi .................. H01L 33/38 257/99 |
| 2006/0231852 A1* | 10/2006 | Kususe ................... H01L 24/06 257/99 |
| 2008/0296603 A1* | 12/2008 | Chu ....................... H01L 33/38 257/99 |
| 2008/0315240 A1* | 12/2008 | Kim ....................... H01L 33/20 257/99 |
| 2010/0187559 A1* | 7/2010 | Han ....................... H01L 33/20 257/99 |
| 2010/0207146 A1* | 8/2010 | Iizuka ................... H01L 33/387 257/98 |
| 2010/0258836 A1* | 10/2010 | Wang ..................... H01L 33/38 257/99 |
| 2010/0294526 A1* | 11/2010 | Farquhar ............ H01L 51/5203 174/50.5 |
| 2011/0095701 A1* | 4/2011 | Tanahashi ........... H01L 51/5203 315/291 |
| 2011/0163346 A1* | 7/2011 | Seo ........................ H01L 33/08 257/99 |
| 2011/0186903 A1* | 8/2011 | Nakanishi ........... H01L 27/3276 257/99 |
| 2012/0007134 A1* | 1/2012 | Miyai ................ H01L 51/5203 257/99 |
| 2012/0032198 A1* | 2/2012 | Yeh ................... H01L 31/02005 257/88 |
| 2012/0286648 A1* | 11/2012 | Pang .................. H01L 51/5203 313/504 |
| 2013/0015584 A1* | 1/2013 | Chen ................ H01L 31/02240 257/773 |
| 2013/0207153 A1* | 8/2013 | Kamiya .................. H01L 33/38 257/99 |
| 2013/0214320 A1* | 8/2013 | Onishi ................... H01L 33/44 257/99 |
| 2014/0091351 A1* | 4/2014 | Tsai ....................... H01L 33/38 257/99 |
| 2014/0175503 A1* | 6/2014 | Hwang .................. H01L 33/38 257/99 |
| 2014/0312764 A1* | 10/2014 | Miyai ..................... H05B 33/06 313/498 |
| 2015/0270316 A1* | 9/2015 | Seki ................... H01L 27/3204 257/40 |
| 2017/0019974 A1* | 1/2017 | Rickers ............. H05B 33/0848 |

* cited by examiner

LIGHT-EMITTING DEVICE WITH ALTERNATING ARRANGEMENT OF ANODE PADS AND CATHODE PADS

CROSS-REFERENCE TO PRIOR APPLICATIONS

This application is the U.S. National Phase application under 35 U.S.C. §371 of International Application No. PCT/EP2014/060537, filed on May 22, 2014, which claims the benefit of European Patent Application No. 13168856.6, filed on May 23, 2013. These applications are hereby incorporated by reference herein.

FIELD OF THE INVENTION

The invention relates to a light-emitting device, in particular, to an organic light-emitting device (OLED). The invention also relates to a production method for producing the light-emitting device, and to a production apparatus for performing the production method.

BACKGROUND OF THE INVENTION

An OLED comprises an anode, a cathode and a light emission region between the anode and the cathode, wherein the light emission region is adapted to emit light, if a voltage is applied between the anode and the cathode. In operation, OLEDs may have an inhomogeneous electrical field between the anode and the cathode, which may lead to an inhomogeneous light emission. For improving the degree of homogeneity of light emission technically complex anode and cathode structures may be used, but this may lead to increased assembly efforts.

SUMMARY OF THE INVENTION

It is an object of the present invention to provide a light-emitting device, particularly an OLED, which has an improved degree of homogeneity of light emission and which can be assembled with reduced efforts. It is a further object of the present invention to provide a production method for producing the light-emitting device with reduced assembly efforts, and to a production apparatus for performing the production method.

In a first aspect of the present invention a light-emitting device is presented, wherein the light-emitting device is a light emission source between a substrate and an encapsulation. The light emission source comprises a light emission region between an anode and a cathode, wherein the light emission region is adapted to emit light if a voltage is applied between the anode and the cathode. The light emission source further comprises an alternating arrangement of anode pads for electrically connecting the anode and cathode pads for electrically connecting the cathode. The alternating arrangement of anode and cathode pads is supported by the substrate, and the encapsulation comprises openings for accessing the alternating arrangement of anode and cathode pads from outside the encapsulation. The light-emitting device further comprises an anode electrical connector for electrically connecting the anode pads through the openings of the encapsulation, and a cathode electrical connector for electrically connecting the cathode pads through the openings of the encapsulation. Finally, the alternating arrangement of anode and cathode pads, the encapsulation, the anode electrical connector and the cathode electrical connector are configured such that the anode pads are electrically connected by a straight part of the anode electrical connector and the cathode pads are electrically connected by a straight part of the cathode electrical connector.

The alternating arrangement of anode and cathode pads results in a more homogenous electrical field between the anode and the cathode and therefore allows for an improved degree of homogeneity of light emission. And because the alternating arrangement of anode and cathode pads, the encapsulation, the anode electric connector and the cathode electrical connector are configured such that the anode pads are electrically connected by a straight part of the anode electrical connector and the cathode pads are electrically connected by a straight part of the cathode electrical connector, the electrical contacting procedure for electrically contacting the anode and cathode pads can be performed relatively easily by just providing the straight parts of the anode electrical connector and the cathode electrical connector on the part of the encapsulation that has the openings. For instance, the electrical connection of the anode and cathode pads can be provided by just depositing two straight metal stripes resulting in reduced assembly efforts for a light-emitting device having an improved degree of homogeneity of light emission.

In the context of the present invention, the term "straight part of the anode/cathode electrical connector" may need some further explanation. The anode and cathode electrical connectors are connectors that electrically interconnect the anode and cathode pads, respectively, through the openings of the encapsulation. The latter implies that the electrical connectors are provided on top of the encapsulation and extend through the openings of the encapsulation up to the anode and cathode pads. According to the invention, at least the part of the anode/cathode electrical connector that interconnects the anode/cathode pads is a "straight" part. This means that, when looking in a direction from the encapsulation towards the substrate, this part of the electrical connector does not have any bends or angles but is a constant direction throughout its length. It may also be that not only the parts for interconnecting the pads are straight, but that several parts of the electrical connector are straight, or that the electrical connector as a whole is straight.

The light-emitting device may be an OLED, wherein the light-emitting region comprises organic layers, which are adapted to emit light, if voltage is applied to the anode and the cathode. The encapsulation may be for protecting the light emission source against environmental influences like moisture, oxygen or other gases, and it may be formed by a thin-film encapsulation (TFE).

The alternating arrangement of anode and cathode pads, the encapsulation, the anode electrical connector and the cathode electrical connector may be configured such that the encapsulation electrically insulates the anode pads from the straight part of the cathode electrical connector and electrically insulates the cathode pads from the straight part of the anode electrical connector. Since the encapsulation is also used for electrically insulating the anode pads from the cathode electrical conductor and the cathode pads from the anode electrical conductor, an additional means like an additional layer may not be needed for providing this electrical insulation, thereby further reducing the assembly efforts.

The light emission source may comprise several sides, and the alternating arrangement of anode and cathode pads may be located at one side of the light emission source only. It has been found that locating the alternating arrangement at one side of the light emission source only can be sufficient for providing a relatively homogeneous emission of the light such that it may not be necessary to provide the alternating arrangement at two or more sides of the light emission source. This can further reduce the assembly efforts.

An insulator may be arranged in regions connecting the anode pads with the anode for electrically insulating these regions from the cathode. An insulator may be arranged in each of these regions. This can simplify deposition of the cathode such that the cathode does not contact the anode and the anode pads.

In a second aspect of the present invention a production method is presented, for producing the light-emitting device of the first aspect. This production method comprises the steps of providing the light emission source, depositing the encapsulation on the light emission source, electrically connecting the anode pads by the anode electrical connector through the openings of the encapsulation, and electrically connecting the cathode pads by the cathode electrical connector through the openings of the encapsulation.

In a third aspect of the present invention a production apparatus is presented, for performing the production method of the second aspect. This production apparatus comprises a light source providing unit for providing the light emission source, an encapsulating unit for depositing the encapsulation on the light emission source, and an electrical connector providing unit for electrically connecting the anode pads by the anode electrical connector and for electrically connecting the cathode pads by the cathode electrical connector through the openings of the encapsulation.

If the light-emitting device is an OLED, the light source providing unit may be adapted to perform known techniques for depositing on the substrate the different components of the OLED such as an anode layer, one or more organic light emission layers and a cathode layer. Also for producing the alternating arrangement of anode pads and cathode pads known techniques can be used by the light source providing unit.

The encapsulating unit may be adapted to perform the step of encapsulating by depositing the encapsulation on the light emission source and removing parts of the encapsulation for generating the openings. The encapsulating unit may be adapted to remove parts of the encapsulation by ablation, particularly laser ablation. However, the encapsulating unit may also be adapted to deposit the encapsulation such that it comprises the openings for accessing the alternating arrangement of anode and cathode pads from outside the encapsulation. For instance, the encapsulation may be deposited in a patterned way, i.e. with the openings, by using, for example, a mask. Moreover, the light source providing unit may be adapted to provide an insulator in regions connecting the anode pads with the anode for electrically insulating these regions from the cathode. The electrical connector providing unit may be adapted to provide the anode and cathode electrical connectors by anisotropic conductive film bonding and/or anisotropic conductive paste bonding and/or a printed circuit board technique.

It shall be understood that the light-emitting device of the first aspect, the production method of the second aspect, and the production apparatus of the third aspect have similar and/or identical embodiments, in particular, as defined in the dependent claims.

It shall be understood that an embodiment of the invention can also be any combination of the dependent claims with the respective independent claim.

These and other aspects of the invention will be apparent from and elucidated with reference to the embodiments described hereinafter.

DETAILED DESCRIPTION OF EMBODIMENTS

Figure 1:
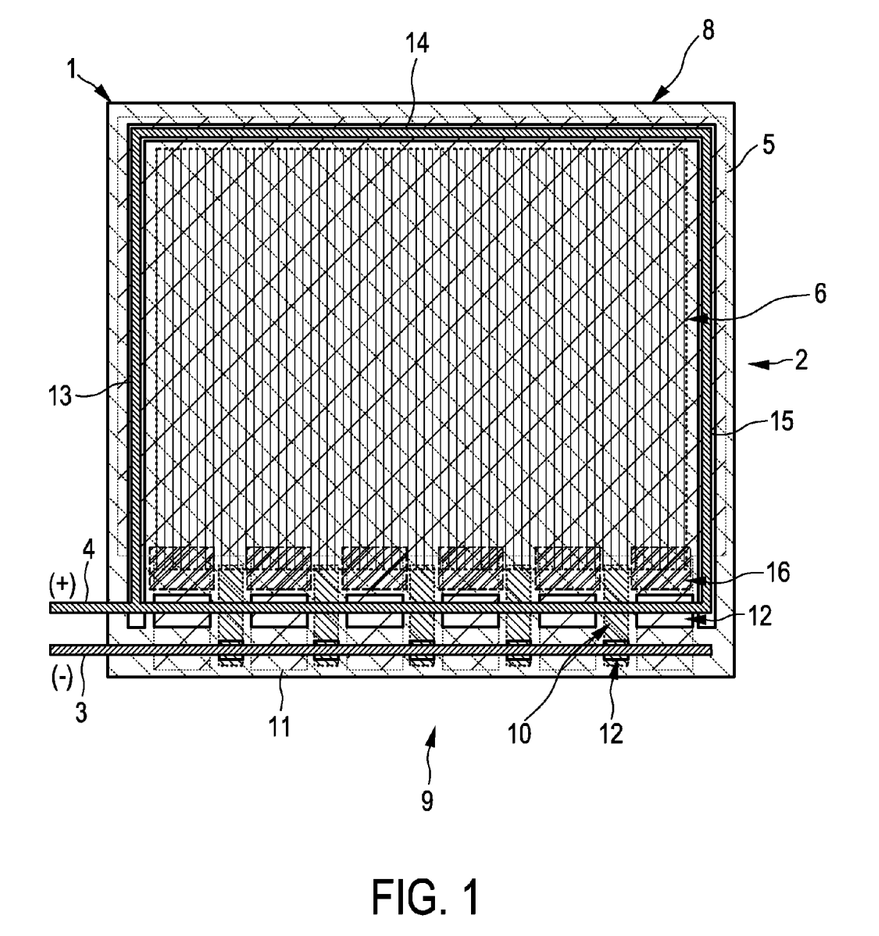
FIG. 1 shows schematically and exemplarily an embodiment of a light-emitting device.

FIG. 1 shows schematically and exemplarily an embodiment of a light-emitting device being an OLED. The OLED 1 comprises a light emission source 2 comprising an anode 5, a cathode 6, a light emission region between the anode 5 and the cathode 6 and an alternating arrangement 9 of anode pads 11 for electrically connecting the anode 5 and cathode pads 10 for electrically connecting the cathode 6. The light emission region is adapted to emit light, if a voltage is applied between the anode 5 and the cathode 6. An insulator 16 is arranged in regions connecting the anode pads 11 with the anode 5, in order to electrically insulate these regions from the cathode 6.

The light emission source 2 of the OLED 1 is located between a substrate (not explicitly shown in FIG. 1) and a thin-film encapsulation (TFE) 8 that encapsulates the light emission source 2. The alternating arrangement 9 of anode and cathode pads 10, 11 is supported by the substrate, and the TFE 8 comprises openings 12 for accessing the alternating arrangement 9 from outside the TFE 8.

Figure 2:
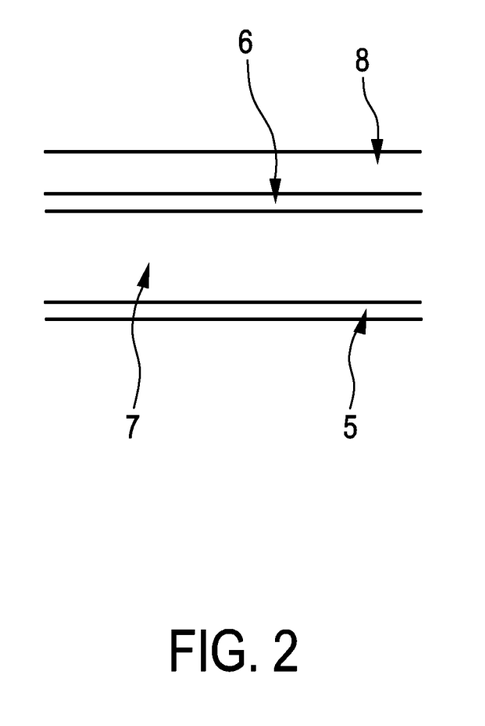
FIG. 2 shows schematically and exemplarily an arrangement of different layers of the light-emitting device.

FIG. 2 shows schematically and exemplarily a sectional view of a part of the OLED 1 comprising the anode 5 and the cathode 6 with the intermediate light emission region 7 and the TFE 8. The openings 12 in the TFE 8 can then be produced by, for instance, plasma etching, laser ablation, etch paste printing, et cetera The light emission region 7 comprises organic layers, which are adapted to emit light, if voltage is applied to the anode 5 and the cathode 6. The TFE 8 is used for protecting the light emission source 2 against environmental influences like moisture, oxygen or other gases. The TFE 8 may comprise SiN and optionally further inorganic and/or organic layers.

The OLED 2 further comprises an anode electrical connector 4 for electrically connecting the anode pads 11 and a cathode electrical connector 3 for electrically connecting the cathode pads 10 through the openings 12 of the TFE 8. The alternating arrangement 9, the encapsulation 8, the anode electrical connector 4 and the cathode electrical connector 3 are configured such that the anode pads 11 are electrically connected by a straight part of the anode electrical connector 4 through the openings 12 of the TFE 8 and the cathode pads 10 are electrically connected by a straight part of the cathode electrical connector 3 through the openings 12 of the TFE 8. In this embodiment, the anode electrical connector 4 and the cathode electrical connector 3 are completely straight. However, in another embodiment they may each only comprise a straight part provided on the TFE 8 with the openings 12 such that they are electrically connected to the anode pads 11 and the cathode pads 10, respectively.

The alternating arrangement 9, the TFE 8, the anode electrical connector 4 and the cathode electrical connector 3 are also configured such that the TFE 8 electrically insulates the anode pads 11 from the straight cathode electrical connector 3 and electrically insulates the cathode pads 10 from the straight anode electrical connector 4. Since the TFE 8 is also used for electrically insulating the anode pads 11 from the cathode electrical connector 3 and the cathode pads 10 from the anode electrical connector 4, an additional means like an additional layer is not needed for providing this electrical insulation, thereby reducing assembly efforts.

The alternating arrangement 9 and the metal stripes, which form in this embodiment the anode and cathode electrical connectors 3, 4, are located at one side of the OLED 1 and, thus, of the light emission source 2 only. The anode electrical connector 4 is further electrically connected to metal stripes 13, 14, 15 deposited on the anode 5 along the remaining three edges of the anode 5, in order to provide a more homogeneous electrical field, which in turn leads to a more homogeneous emission of the light.

In FIG. 1 the different layers of the OLED 1 are schematically and exemplarily shown partly transparent for illustrative purposes, i.e. in order to show the different layers of the OLED 1. In order to further clarify the layer structure, FIGS. 3 to 6 show several layers of the OLED 1 separately from other layers or other components of the OLED.

Figure 3:
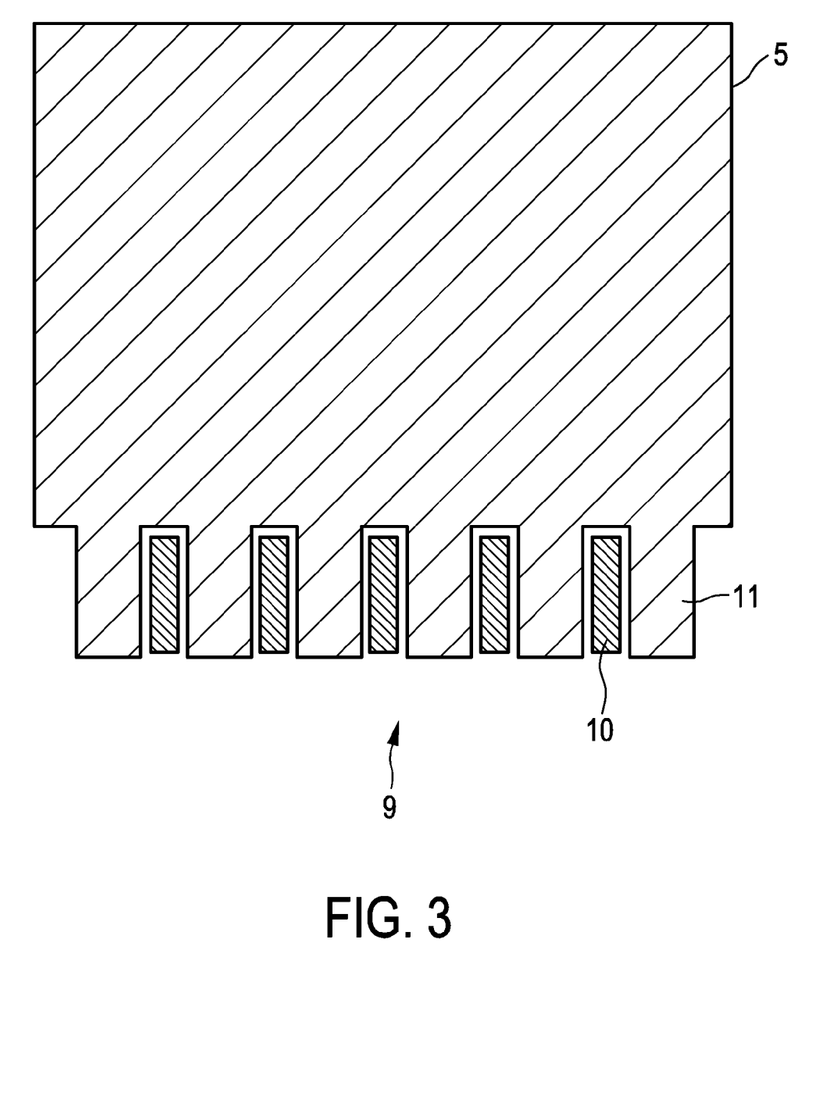
FIGS. 3 to 6 show schematically and exemplarily several components of the light-emitting device.
Figure 4:
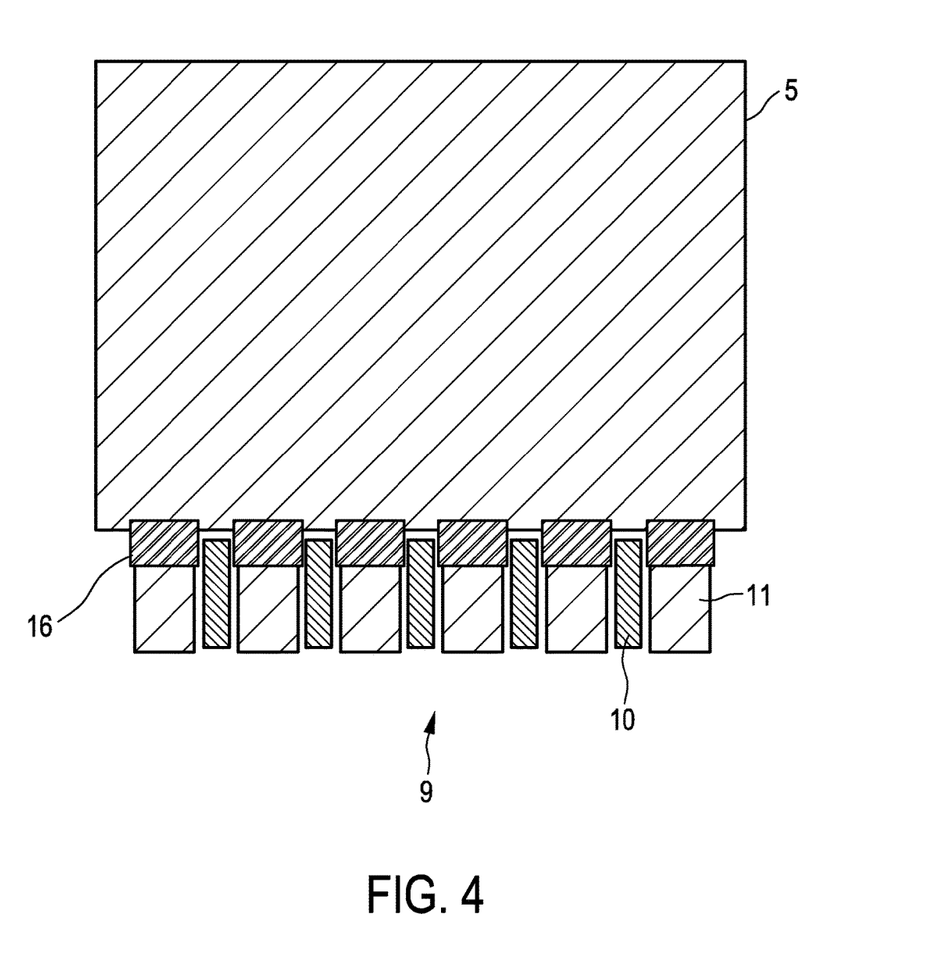
Figure 5:
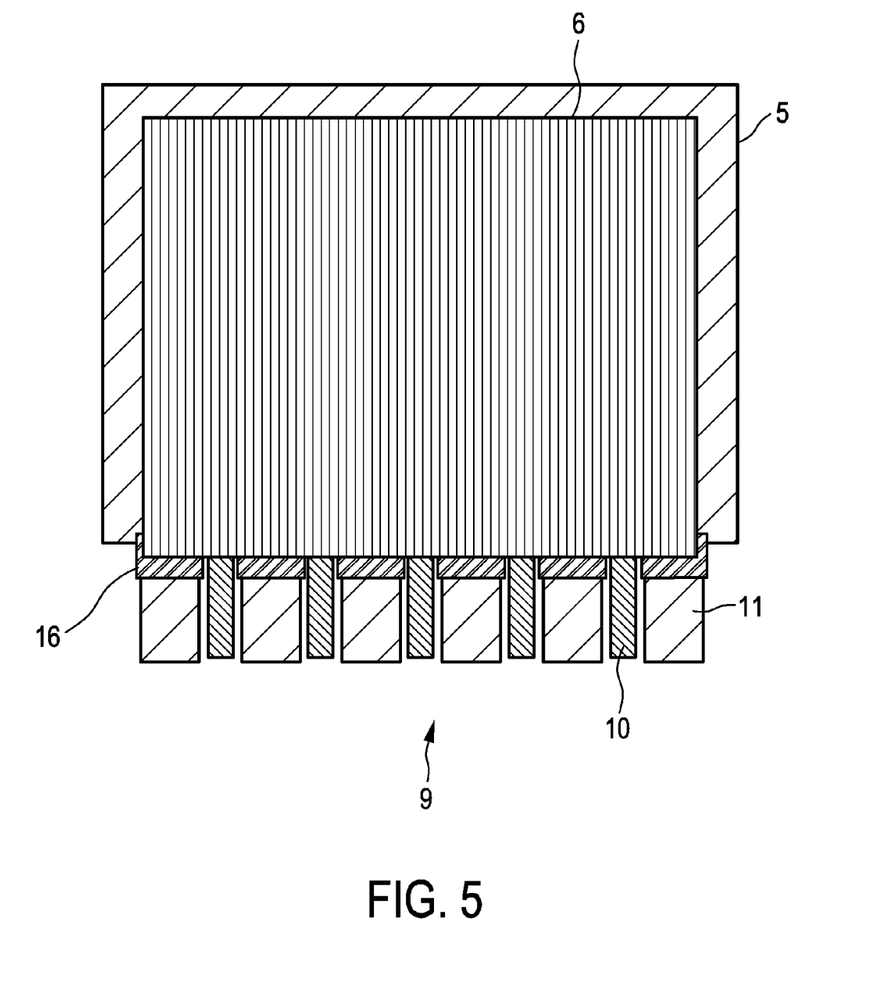
Figure 6:
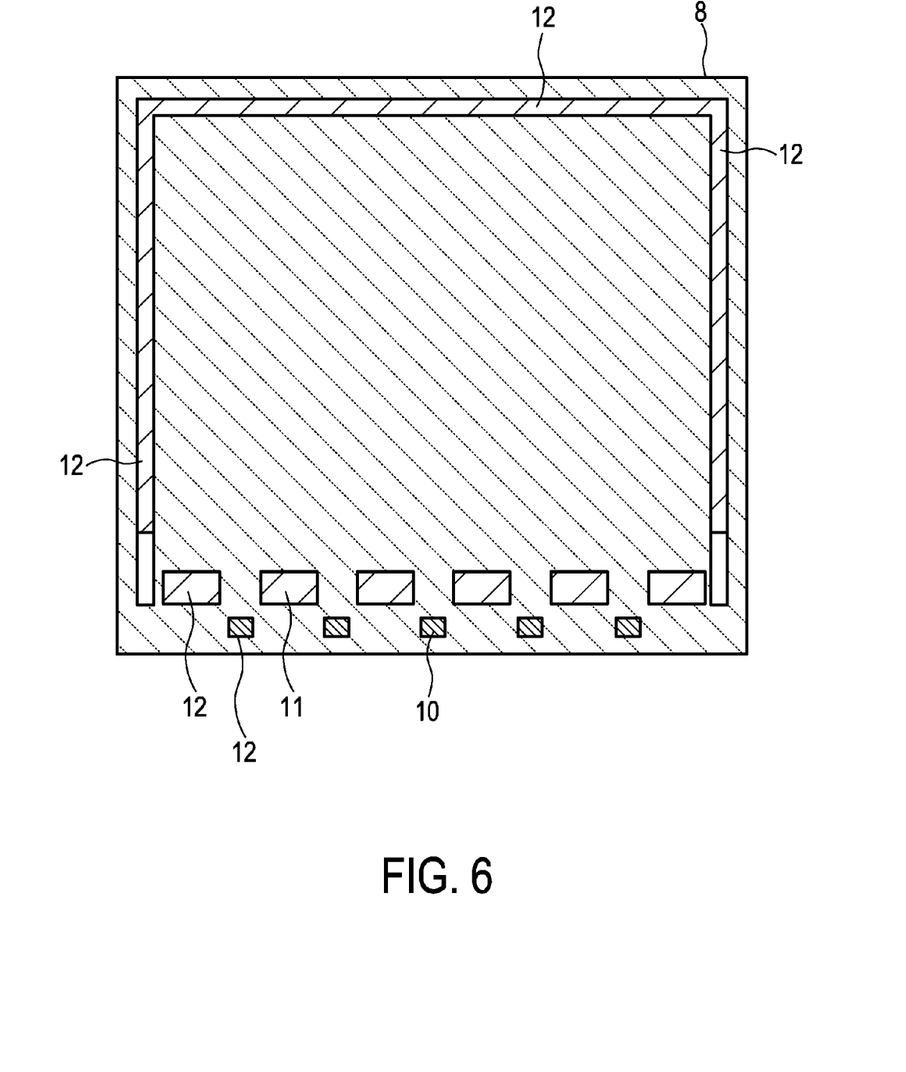

FIG. 3 shows schematically and exemplarily the anode 5, the anode pads 11 and the cathode pads 10. FIG. 4 shows additionally the insulators 16 arranged in regions connecting the anode pads 11 with the anode 5. FIG. 5 shows the components of the OLED 1, which are present, after the cathode 6 has been provided. FIG. 6 shows the OLED 1, after the TFE 8 has been provided and the openings 12 have been generated in the TFE 8. In a next step the anode electrical connector 4 and the cathode electrical connector 3 and the metal stripes 13, 14, 15 would be provided, in order to obtain the configuration schematically and exemplarily shown in FIG. 1.

Figure 7:
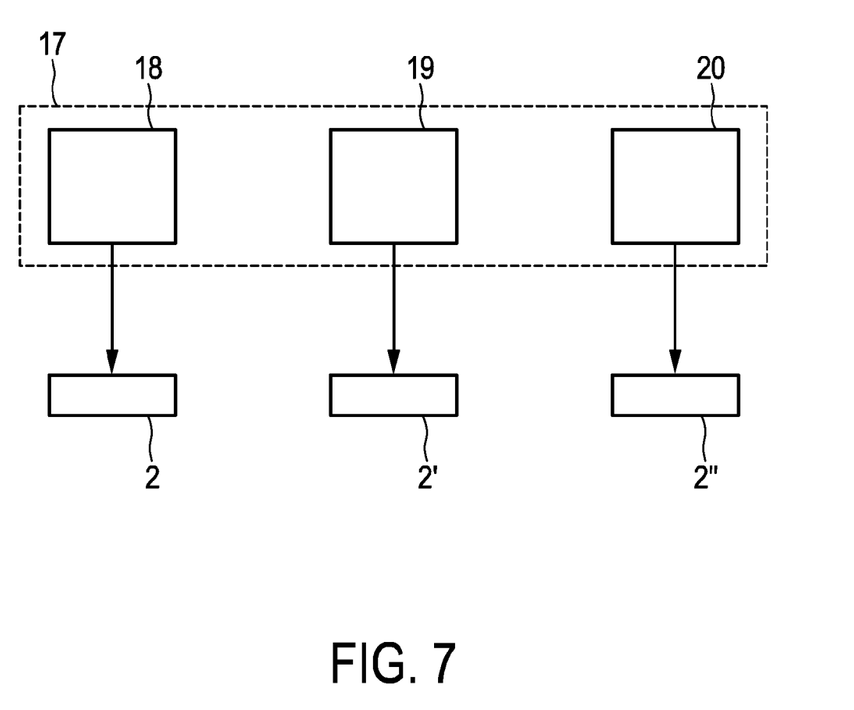
FIG. 7 shows schematically and exemplarily an embodiment of a production apparatus for producing the light-emitting device.

FIG. 7 shows schematically and exemplarily an embodiment of a production apparatus for producing the OLED 1. The production apparatus 17 comprises a light source providing unit 18, an encapsulating unit 19 and an electrical connector providing unit 20. The light source providing unit 18 provides the light emission source 2 comprising the anode 5, the cathode 6, the light emission region 7 between the anode 5 and the cathode 6 and the alternating arrangement 9 of anode pads 11 for electrically connecting the anode 5 and cathode pads 10 for electrically connecting the cathode 6, wherein the light emission region 7 is adapted to emit light, if a voltage is applied between the anode 5 and the cathode 6. The encapsulating unit 19 is adapted to encapsulate the light emission source 2 by using the TFE 8, wherein the TFE 8 comprises openings 12 for assessing the alternating arrangement 9 of anode and cathode pads 10, 11 from outside the TFE 8. The electrical connector providing unit 20 is adapted to electrically connect the anode pads 11 by an anode electrical connector 4 and to electrically connect the cathode pads 10 by the cathode electrical connector 3 through the openings 12 of the TFE 8.

The production apparatus 17 is adapted such that the alternating arrangement 9, the TFE 8, the anode electrical connector 4 and the cathode electrical connector 3 are configured such that the anode pads 11 are electrically connected by the straight anode electrical connector 4 through the openings 12 of the TFE 8 and the cathode pads 10 are electrically connected by the straight cathode electrical connector 3 through the openings 12 of the TFE 8.

Figure 8:
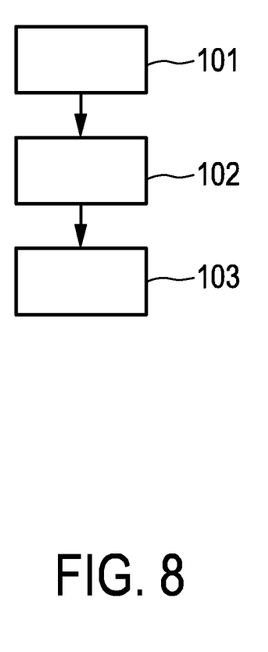
FIG. 8 shows a flowchart exemplarily illustrating an embodiment of a production method for producing the light-emitting device.

In the following an embodiment of a production method for producing the OLED 1 will exemplarily be described with reference to a flowchart shown in FIG. 8.

In step 101 the light source providing unit 18 provides the light emission source 2 comprising the anode 5, the cathode 6, the light emission region 7 between the anode 5 and the cathode 6 and the alternating arrangement 9 of anode pads 11 for electrically connecting the anode 5 and of cathode pads 10 for electrically connecting the cathode 6, wherein the light emission region 7 is adapted to emit light, if a voltage is applied between the anode 5 and the cathode 6. For providing the light emission source 2 the light source providing unit 18 performs known deposition techniques for depositing different components of an OLED, i.e. the anode layer 5, organic light emission layers of the intermediate region 7 and the cathode layer 6, on a substrate. Also for producing the alternating arrangement of the anode pads 11 and the cathode pads 10 known techniques can be used by the light source providing unit 18. For instance, a substrate, which is provided with a conductive layer which is preferentially not a metal layer, but, for example, an ITO layer or another electrically conductive and optically transparent layer, can be provided, wherein the conductive layer can be patterned by using known patterning techniques for forming the anode layer 5 and the alternating arrangement of anode and cathode pads 11, 10. Then, the insulator 16 can be provided on regions connecting the anode pads 11 with the anode layer 5, in order to electrically insulate these regions from the cathode 6, when the cathode layer 6 is deposited. After the insulator 16 has been provided on the regions connecting the anode pads 11 with the anode layer 5, further layers like organic emission layers of the intermediate region 7 and the cathode 6 are deposited. The cathode layer 6 is deposited such that it is electrically connected with the cathode pads 10, but electrically insulated from the anode pads 11 due to the insulator 16. The insulator 16 may be provided by photolithography or another technique. Moreover, the insulator 16 may be a novolac with a photoinitiator for patterning. For instance, spin/slit coating and subsequent photolithographic patterning of the insulator can be used.

In step 102 the encapsulating unit 19 encapsulates the light emission source 2 by using the TFE 8, wherein the TFE 8 comprises the openings 12 for assessing the alternating arrangement 9 of anode and cathode pads 10, 11 from outside the TFE 8. In particular, the encapsulating unit 19 deposits the TFE 8 on the light emission source 2 and then removes parts of the TFE 8 for generating the openings 12. The parts of the TFE 8 are preferentially removed by laser ablation. However, also other ablation techniques like etching techniques can be used for removing the TFE 8 at the locations of the openings 12. The light emission source 2 with the TFE 8 is indicated in FIG. 7 by reference number 2'.

In step 103 the electrical connector providing unit 20 electrically connects the anode pads 11 by the anode electrical connector 4 and electrically connects the cathode pads 10 by the cathode electrical connector 3 through the openings 12 of the TFE 8. In particular, straight metal stripes, which form the anode electrical connector 4 and the cathode electrical connector 3, are provided such that the anode pads 11 can be electrically connected via the openings 12 to a voltage source via a straight metal stripe forming the anode electrical connector 4 and such that the cathode pads 10 can be electrically connected to the voltage source via the openings 12 by using a straight metal stripe forming the cathode electrical connector 3. The electrical connector providing unit 20 provides the metal stripes preferentially by anisotropic conductive film bonding and/or anisotropic conductive paste bonding and/or a printed circuit board technique. The light emission source 2 where the cathode pads 10 are electrically contacted by the cathode electrical connector 3 through the openings 12 in the TFE 8 and where the anode pads 11 are electrically contacted by the anode electrical connector 4 through the openings 12 in the TFE 8 is indicated in FIG. 7 by reference number 2".

An OLED generally comprises a carrier, which may be a plastic or glass carrier, coated with a set of functional coatings forming at least the anode, the cathode and the intermediate organic layers. These coatings have to be laterally patterned to provide the required functionality, for instance, they may be patterned such that cathode and anode contact areas are separated. Both, coatings and patterning processes, contribute generally significantly to substrate costs and hence are subject to investigation when cost saving potential is evaluated.

Usually for bottom emitting devices a transparent and conducting coating like a transparent conductive oxide (TCO) coating, a poly(3,4-ethylenedioxythiophene)poly (styrenesulfonate) (PEDOT:PSS) coating et cetera is used as anode. Those coatings, however, provide only limited conductivity for the sake of high transmission. Metalized support structures may therefore be used to allow for certain lateral dimensions of a device combined with a certain minimum brightness homogeneity. Homogeneity is not only an aesthetic aspect but may—in extreme situations—also alter lifetime/reliability of a device. For instance, inhomogeneities may lead to hot spots, which in turn may result in organic deterioration.

Usually simple device designs comprise a metal frame supporting the anode contact area. This metal frame allows having the same voltage along the edge of the device. In addition, a metal contact pad is used to support/provide the cathode contact. Metal is subject of corrosion, hence metallization needs to be realized in a way to limit corrosion which is usually realized by additional layers. Thus, metallization ends up with a sequence of layers like MoNb—AlNd—MoNb (MAM), Cr—AlNd—Cr et cetera, which do further drive costs for patterning and still do not fully prevent corrosion. Removing the metal would therefore help a lot in saving costs, but will lead to a loss of homogeneity of the resulting devices and limit lateral dimensions of the device.

Figure 9:
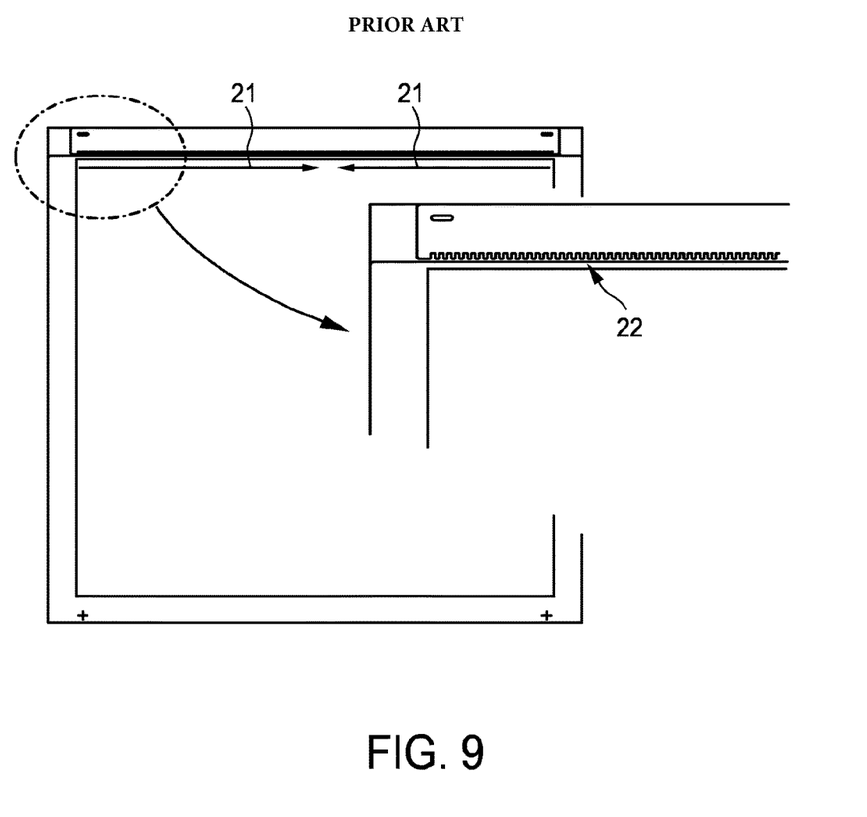
FIG. 9 shows a prior art OLED illustrating a prior art solution for a voltage drop problem.

A problem regarding homogeneity in known large devices without metallization is along the anode/cathode separation as here the voltage drop of the anode material, i.e. underneath the cathode contact, is biggest due to the distance. In metal supported devices a thin metal stripe 22 contacted to the anode frame may therefore be applied to limit the voltage drop as schematically and exemplarily indicated in FIG. 9. However, realizing this thin metal stripe 22 increases the production time of the OLED and the costs. FIG. 9 shows a typical prior art layout, wherein the arrows 21 indicate the direction of the voltage drop, which is reduced due to the metal support line 22.

One approach to at least limit the problem of voltage drop on a limited conductive anode layer, without using the metal stripe 22, is to support it by a metallization applied during assembly, for instance, by ACF/ACP bonding a metal stripe. This, however, is generally only possible at the outer parts of the device and hence is no option for the voltage drop along the direction indicated by the arrows 21, i.e. on the anode/cathode separation.

One solution would be to limit the length of the cathode contact, in order to reduce the voltage drop of the anode underneath, but this only works for a limited dimension of the device and certain minimum cathode conductivity. Especially it is problematic for high current devices. Hence, it is not a general solution, especially for big devices.

The OLED described above with reference to FIGS. 1 and 2 provides an approach to compensate for the voltage drop "inside" the device where preferentially metal is missing (arrows 21 in FIG. 1). The proposed design is particularly useful for an OLED layout where the material used for the contact area is the same as for the electrode.

The OLED described above with reference to FIGS. 1 and 2 has a cathode contact area which is shaped in a way that several anode aligned contacts, i.e. the anode pads 11, are separated by corresponding cathode contacts, i.e. the cathode pads 10, on a limited distance, i.e. a distance being preferentially so small that the finally resulting light emission fulfills a desired homogeneity requirement. Then, both, anode and cathode contacts areas, are contacted each via a single metallization strip provided by, for instance, ACF or PCB or any other technique.

The distance between the anode contacts, i.e. between the anode pads 11, preferentially corresponds to the tolerated luminance drop. A three-dimensional model taking into account lateral current distribution over each electrode and T° distribution can be used to optimize the OLED layout and find the dimensions which allow reaching specifications desired by customers.

As can be seen in FIGS. 3 to 6 and also in FIG. 1 the cathode contact 10 is separated and interleaved supporting contacts 11 to the anode layer are created. These contacts 11 may then be contacted by ACF/ACP bonds or an equivalent technology. The same may be realized for the cathode contact pads 10. With this approach the distance of voltage drop within the anode layer can be limited to the distance between two contact support contacts and hence the homogeneity of the resulting device can be improved.

In principle this technique can also be applied to not just on one side of the device, but also on the other sides as well. Usually, one side however is enough as the resistivity of the cathode is not the limiting factor for homogeneity. For transparent devices, however, this might be required as no longer the anode is the film with the worst electrical conductivity. Here, the voltage drop as indicated in FIG. 9 may also occur on the cathode which in turn may be supported by such kind of structures.

One feature of OLEDs for lighting is its ability to represent a complete luminaire without the requirement of external reflectors. Moreover, the design, i.e. shape, color et cetera, of an OLED may be provided as desired. The OLED described above with reference to FIGS. 1 and 2 is preferentially configured to realize a homogeneous device having desired design features. The exact positions and dimensions of the pads 10, 11 are preferentially evaluated by testing or simulation tools for the individual designs considering several parameters like layout, OLED stack performance, anode conductivity et cetera. For instance, a commercial finite element software package with a three-dimensional coupled electro-thermal model developed like the model developed by Philips Lumiblade may be used.

Figure 10:
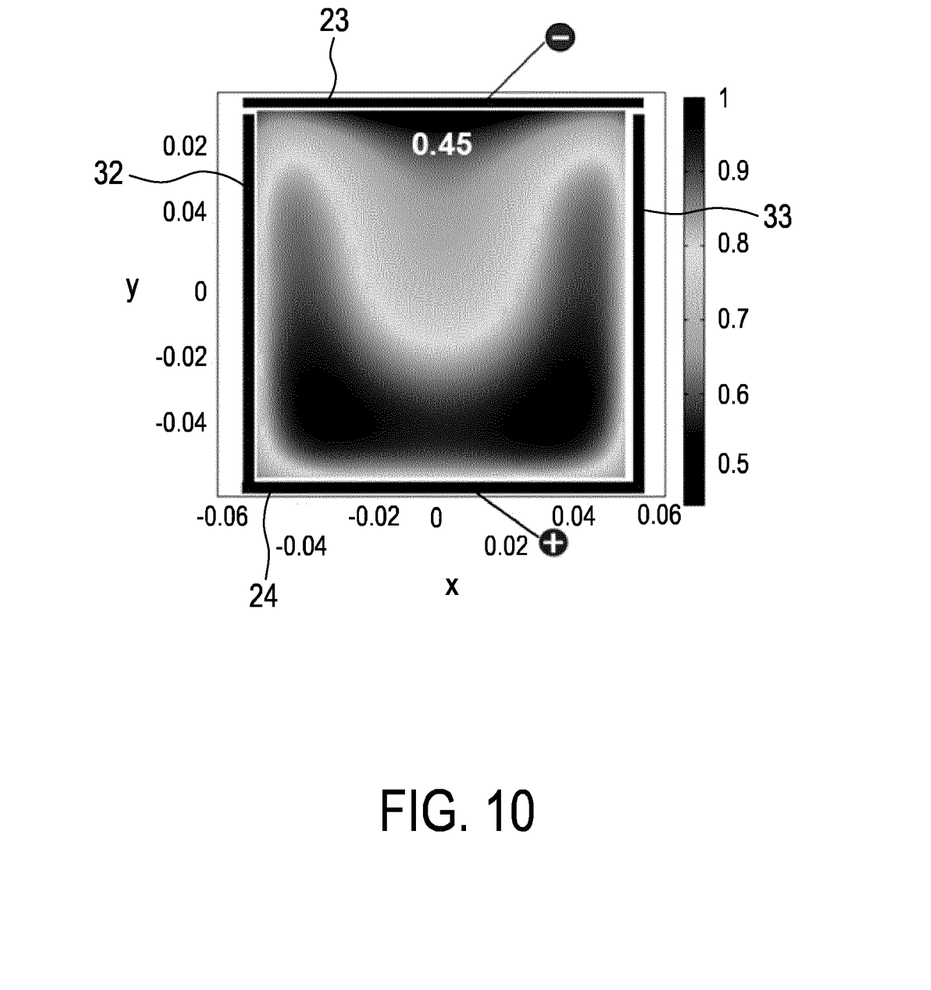
FIGS. 10 and 11 illustrate intensity distributions for different contacting arrangements of an OLED.
Figure 11:
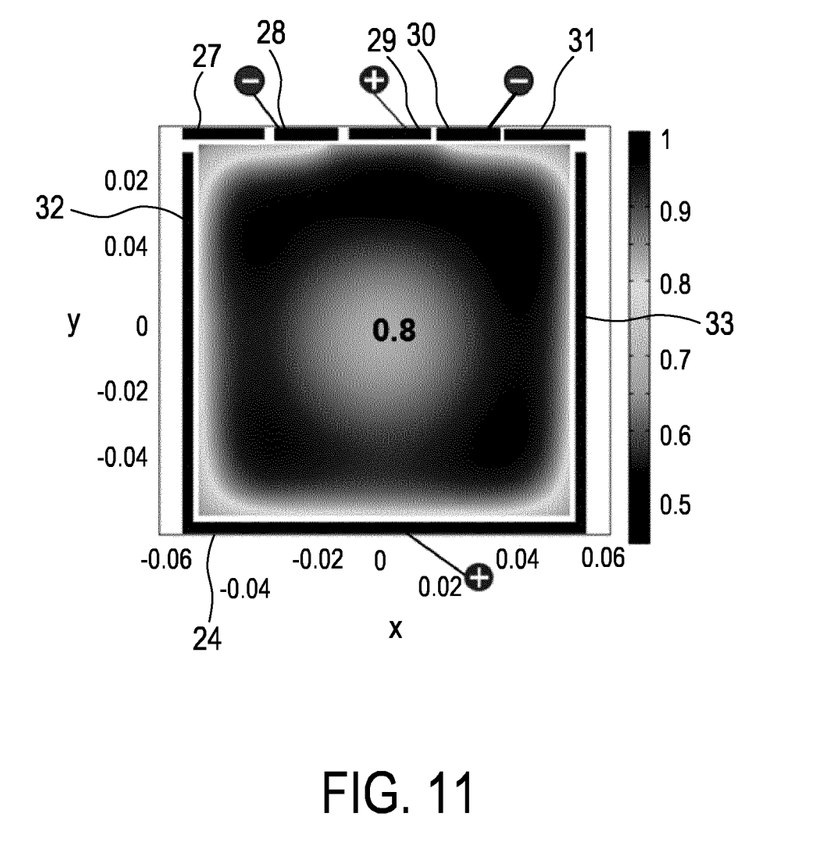

FIGS. 10 and 11 exemplarily illustrate brightness distributions for different contact area arrangements for a rectangular OLED covering an area of 100×100 mm². In these examples the anode is formed by an indium tin oxide (ITO) layer only.

FIG. 10 shows a configuration with a first metal stripe 23 forming a cathode contact and a second metal stripe 24 arranged on a side of the OLED being opposite to the side where the first metal stripe 23 is located. The second metal stripe 24 forms an anode contact. The anode contact 24 is electrically connected with two further metal stripes 32, 33 located at the remaining two sides of the OLED. The metal stripes 24, 32, 33 are provided on and are electrically in contact with the anode layer being, for instance, an ITO layer. As can be seen in FIG. 10, the resulting intensity distribution is rather inhomogeneous, i.e. the ratio of the smallest intensity to the highest intensity is about 0.45. FIG. 11 shows a configuration with an alternating arrangement of anode contacts 27, 29, 31, i.e. of anode pads, and cathode contacts 28, 30, i.e. cathode pads, at one side. On the opposite side a metal stripe 24 is provided, which is electrically connected with metal stripes 32, 33. Also in this configuration the metal stripes 24, 32, 33 are provided on and are electrically in contact with the anode layer being, for instance, an ITO layer. It can be seen in FIG. 11 that the resulting intensity distribution is rather homogeneous, i.e. the ratio of the smallest intensity to the highest intensity is about 0.8. The metal stripes can be ACF bonded connectors.

The OLED described above with reference to FIGS. 1 and 2 can be produced by using a process in which the TFE is removed on contact areas, wherein the contact areas for the anode and the cathode are designed in a way that in two rows an alternating ablation procedure can be performed for providing in each row contacts to the anode or the cathode, respectively. This allows contacting either cathode contact pads or anode contact pads by a simple linear bond stripe, which can lead to a significant reduction of the efforts for electrically contacting the anode and the cathode.

The fabrication is preferentially in line with the conventional OLED fabrication. After the thin film encapsulation process has been completed, which may be regarded as being a pre-requisite for the contacting procedure, a local thin film encapsulation removal process is preferentially applied for generating the openings in the TFE, through which the anode and cathode contact pads are electrically connected by the anode and cathode electrical connectors, respectively. This local thin film encapsulation removal process is preferentially a laser ablation process. However, also another removal technique can be used for locally removing the TFE. The fields of removal have to be aligned with the substrate layout such that the correct contact pads are matched. The non-removed TFE is preferentially used as electrical insulation towards the contact strip, i.e. towards the anode and cathode electrical connectors, applied after the selective TFE removal.

The OLED described above with reference to FIGS. 1 and 2 can be adapted to be used for lighting and decorative applications or for other purposes. The OLED can especially be adapted to be used in applications where larger lateral dimensions are required.

Although in above described embodiments the alternating arrangement of anode and cathode pads is arranged at one side of the light emission source only, it can also be arranged at two or more sides of the light emission source.

Although in above described embodiments the encapsulation is provided by firstly depositing the encapsulating layer and then removing parts of this layer for generating the openings, in other embodiments the encapsulating layer may directly be deposited with openings by using, for instance, a mask.

Although in above described embodiments the light-emitting device is an OLED, in other embodiments the light-emitting device can also be another lighting device like a non-organic light-emitting device.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Procedures like the deposition of the different layers of the light emission source on a substrate, the deposition of the TFE, the local removal of the TFE for providing the openings, et cetera performed by one or several units or devices can be performed by any other number of units or devices. For instance, steps 101 and 102 can be performed by a single unit or by any other number of different units. The control of the production apparatus for producing the light-emitting device in accordance with the production method for producing the light-emitting device can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to a light-emitting device like an OLED comprising a light emission region between an anode and a cathode. An alternating arrangement of anode pads for electrically connecting the anode and cathode pads for electrically connecting the cathode and an encapsulation are configured such that the anode and cathode pads are electrically connectable by straight anode and cathode electrical connectors through openings of the encapsulation. The alternating arrangement of the anode and cathode pads can lead to a more homogenous electrical field between the anode and the cathode and therefore allows for an improved degree of homogeneity of light emission. Moreover, since the alternating arrangement of the anode and cathode pads is connectable by corresponding straight connectors, the contacting of the pads can be performed technically relatively easily.

The invention claimed is:

1. A light-emitting device comprising a light emission source between a substrate and a thin-film encapsulation,
   wherein the light emission source comprises a light emission region between an anode and a cathode, the light emission region being adapted to emit light if a voltage is applied between the anode and the cathode, the light emission source further comprising an alternating arrangement of anode pads for electrically connecting the anode and cathode pads for electrically connecting the cathode, the alternating arrangement of anode and cathode pads being supported by the substrate, wherein the thin-film encapsulation overlies the anode and cathode pads and comprises openings for accessing the alternating arrangement of anode and cathode pads from outside the thin-film encapsulation, wherein the light-emitting device further comprises an anode electrical connector for electrically interconnecting the anode pads through the openings of the thin-film encapsulation over the anode pads and for electrically connecting the anode pads to a voltage source, and a cathode electrical connector for electrically interconnecting the cathode pads through the openings of the thin-film encapsulation over the cathode pads and for electrically connecting the cathode pads to the voltage source, wherein the alternating arrangement of anode and cathode pads, the thin-film encapsulation, the anode electrical connector and the cathode electrical connector are configured such that the anode pads are electrically connected by a straight part of the anode electrical connector and the cathode pads are electrically connected by a straight part of the cathode electrical connector, the straight parts of the anode and cathode electrical connectors being metal stripes that have been deposited on the thin-film encapsulation, and wherein the alternating arrangement of anode and cathode pads, the thin-film encapsulation, the anode electrical connector and the cathode electrical connector are further configured such that the thin-film encapsulation electrically insulates the anode pads from the overlying straight part of the cathode electrical connector and electrically insulates the cathode pads from the overlying straight part of the anode electrical connector.

2. The light-emitting device as defined in claim 1, wherein the light emission source comprises several sides, and wherein the alternating arrangement of anode and cathode pads is located at one side of the light emission source only.

3. The light-emitting device as defined in claim 1, wherein an insulator is arranged in regions connecting the anode pads with the anode for electrically insulating these regions from the cathode.

4. The light-emitting device as defined in claim 1, wherein the light-emitting device is an organic light-emitting device.

5. The light-emitting device of claim 1 wherein the alternating arrangement of anode and cathode pads are on one side of a face of the light-emitting device, wherein the anode extends to remaining sides of the face of the light-emitting device, and wherein the anode electrical connector is further electrically connected to metal stripes deposited on the anode along the remaining sides of the light-emitting device.

6. A production method for producing a light-emitting device, wherein the production method comprises the steps of:

providing a substrate, providing a light emission source on a substrate, wherein the light emission source comprises a light emission region between an anode and a cathode, the light emission region being adapted to emit light if a voltage is applied between the anode and the cathode, the light emission source further comprising an alternating arrangement of anode pads for electrically connecting the anode and cathode pads for electrically connecting the cathode, the alternating arrangement of anode and cathode pads being supported by the substrate, depositing the thin-film encapsulation on the light emission source, providing openings in the thin-film encapsulation for accessing the alternating arrangement of anode and cathode pads from outside the thin-film encapsulation, depositing a first metal stripe as a straight part of an anode electrical connector on the thin-film encapsulation to electrically interconnect the anode pads through the openings of the thin-film encapsulation over the anode pads for electrically connecting the anode pads to a voltage source, depositing a second metal stripe as a straight part of a cathode electrical connector on the thin-film encapsulation to electrically interconnect the cathode pads through the openings of the thin-film encapsulation over the cathode pads for electrically connecting the cathode pads to the voltage source, wherein the thin-film encapsulation electrically insulates the anode pads from the overlying straight part of the cathode electrical connector and electrically insulates the cathode pads from the overlying straight part of the anode electrical connector.

* * * * *